(12) United States Patent
Tang et al.

(10) Patent No.: US 8,222,140 B2
(45) Date of Patent: Jul. 17, 2012

(54) PITCH DIVISION PATTERNING TECHNIQUES

(75) Inventors: Sanh D. Tang, Boise, ID (US); Scott Sills, Boise, ID (US); Haitao Liu, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 12/646,510

(22) Filed: Dec. 23, 2009

(65) Prior Publication Data
US 2011/0151668 A1 Jun. 23, 2011

(51) Int. Cl.
*H01L 21/44* (2006.01)
(52) U.S. Cl. .............. 438/671; 438/694; 257/E21.036
(58) Field of Classification Search ............... 438/671, 438/694; 257/E21.036
See application file for complete search history.

(56) References Cited

U.S. PATENT DOCUMENTS

| | | | |
|---|---|---|---|
| 6,373,553 B1 | 4/2002 | Vivek | |
| 6,618,791 B1 | 9/2003 | Dodd et al. | |
| 7,470,492 B2 | 12/2008 | Bigwood et al. | |
| 7,539,812 B2 | 5/2009 | Tetrick | |
| 2005/0133851 A1 | 6/2005 | Forbes | |
| 2005/0265076 A1 | 12/2005 | Forbes | |
| 2005/0269626 A1 | 12/2005 | Forbes | |
| 2005/0287795 A1 | 12/2005 | Torek et al. | |
| 2007/0099431 A1* | 5/2007 | Li | 438/735 |
| 2008/0149987 A1* | 6/2008 | Alapati et al. | 257/315 |
| 2008/0242034 A1 | 10/2008 | Mokhlesi et al. | |
| 2009/0035584 A1 | 2/2009 | Tran et al. | |
| 2009/0072303 A9 | 3/2009 | Prall et al. | |
| 2009/0180324 A1 | 7/2009 | Ramaswamy et al. | |
| 2009/0258492 A1 | 10/2009 | Sant et al. | |

OTHER PUBLICATIONS

Sills, Scott, "Methods of Fabricating Substrates", U.S. Appl. No. 12/328,464, filed Dec. 4, 2008, Whole Document.
Sills, Scott, "Methods of Fabricating Substrates", U.S. Appl. No. 12/328,448, filed Dec. 4, 2008, whole document.
Sills, Scott, "Methods of Fabrication Substrates", U.S. Appl. No. 12/328,435, filed Dec. 4, 2008, whole document.
Sills, Scott, "Methods of Forming Patterns", U.S. Appl. No. 12/397,083, filed Mar. 3, 2009, whole document.
Sills, Scott, "Methods of Forming Patterns on Substrates", U.S. Appl. No. 12/409,308, filed Mar. 23, 2009, whole document.

* cited by examiner

*Primary Examiner* — Tony Tran
(74) *Attorney, Agent, or Firm* — Blakely, Sokoloff, Taylor & Zafman LLP

(57) ABSTRACT

Embodiments of the invention comprise pitch division techniques to extend the capabilities of lithographic techniques beyond their minimum pitch. The pitch division techniques described herein employ additional processing to ensure pitch divided lines have the spatial isolation necessary to prevent shorting problems. The pitch division techniques described herein further employ processing acts to increase the structural robustness of high aspect ratio features.

9 Claims, 10 Drawing Sheets

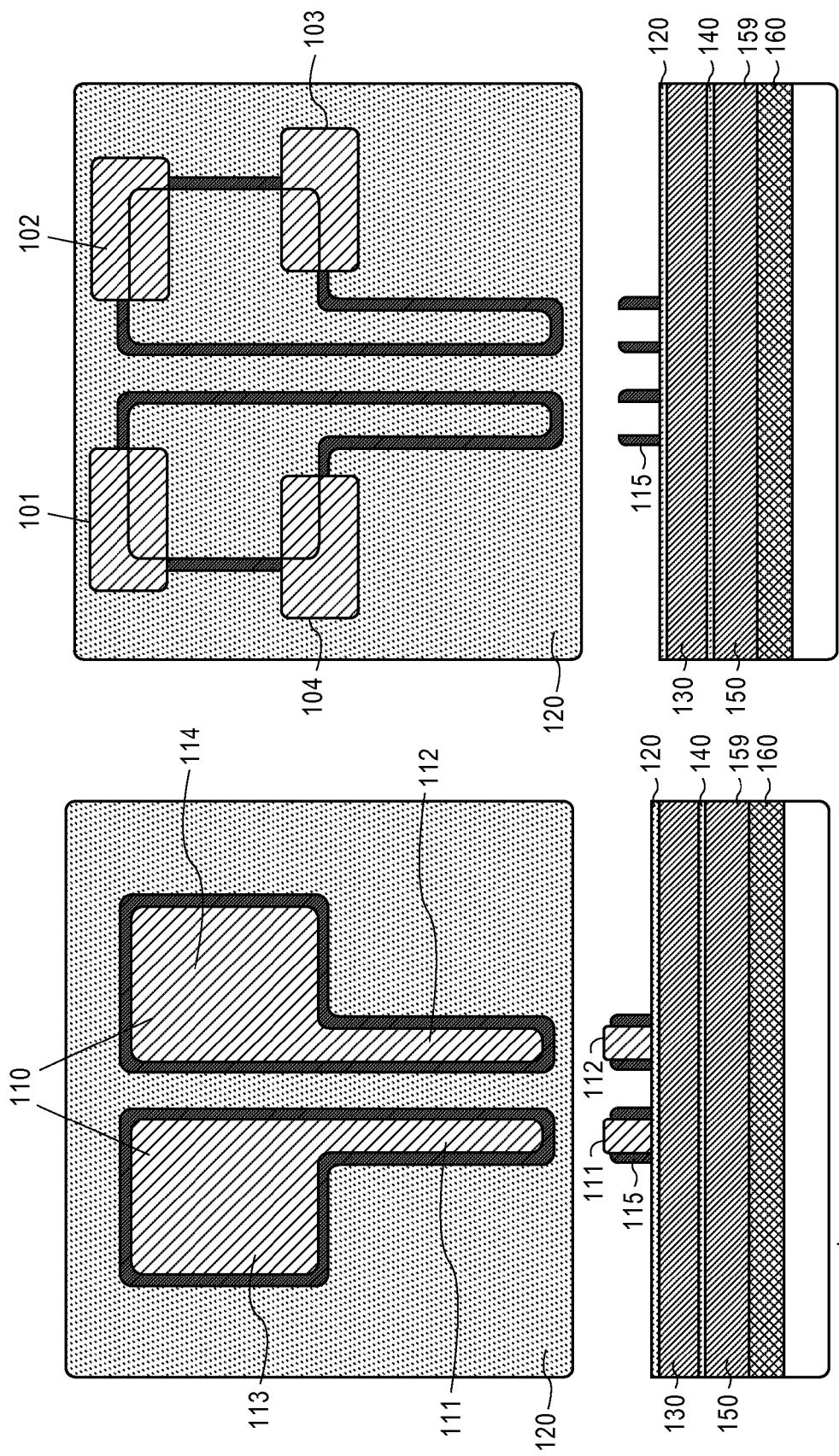

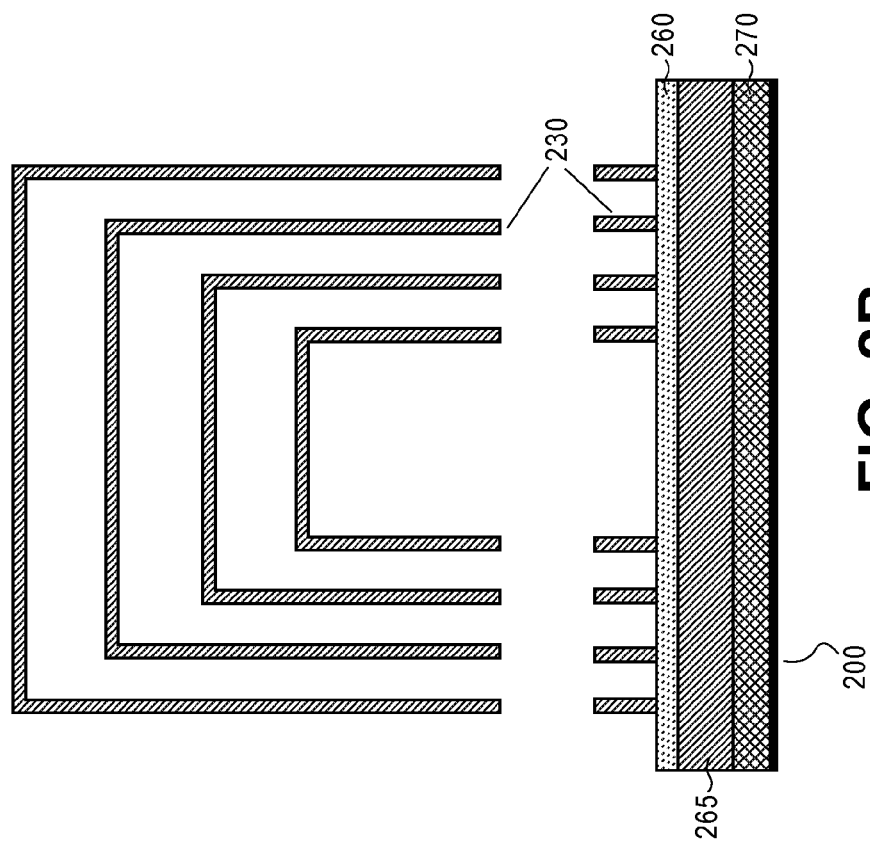
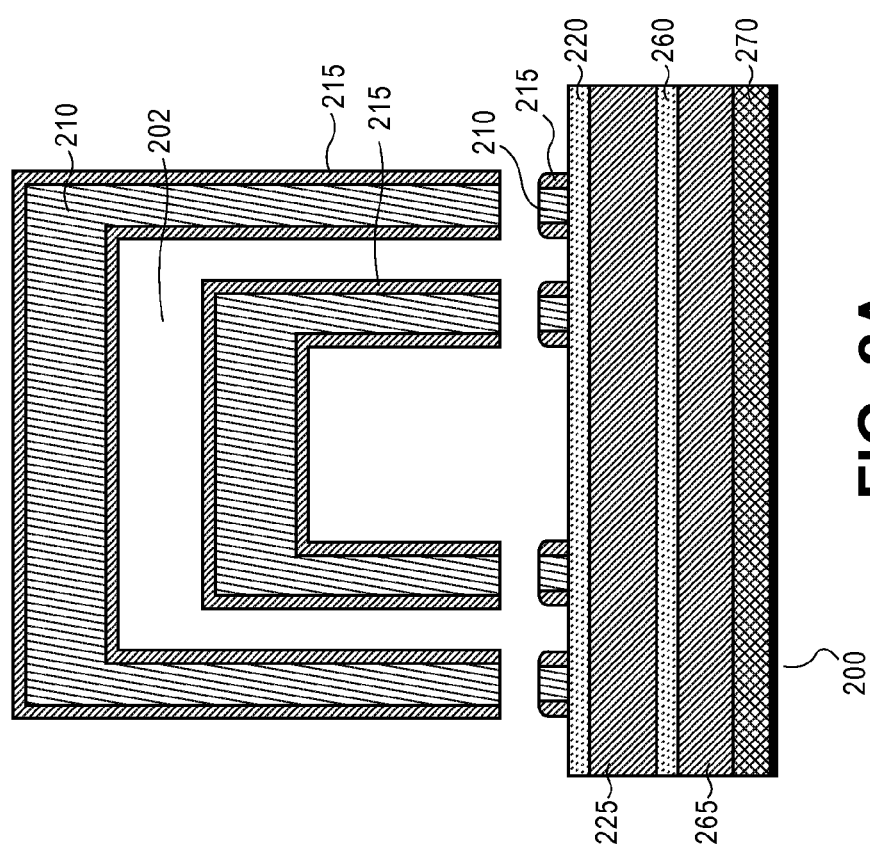
FIG. 2A
FIG. 2B

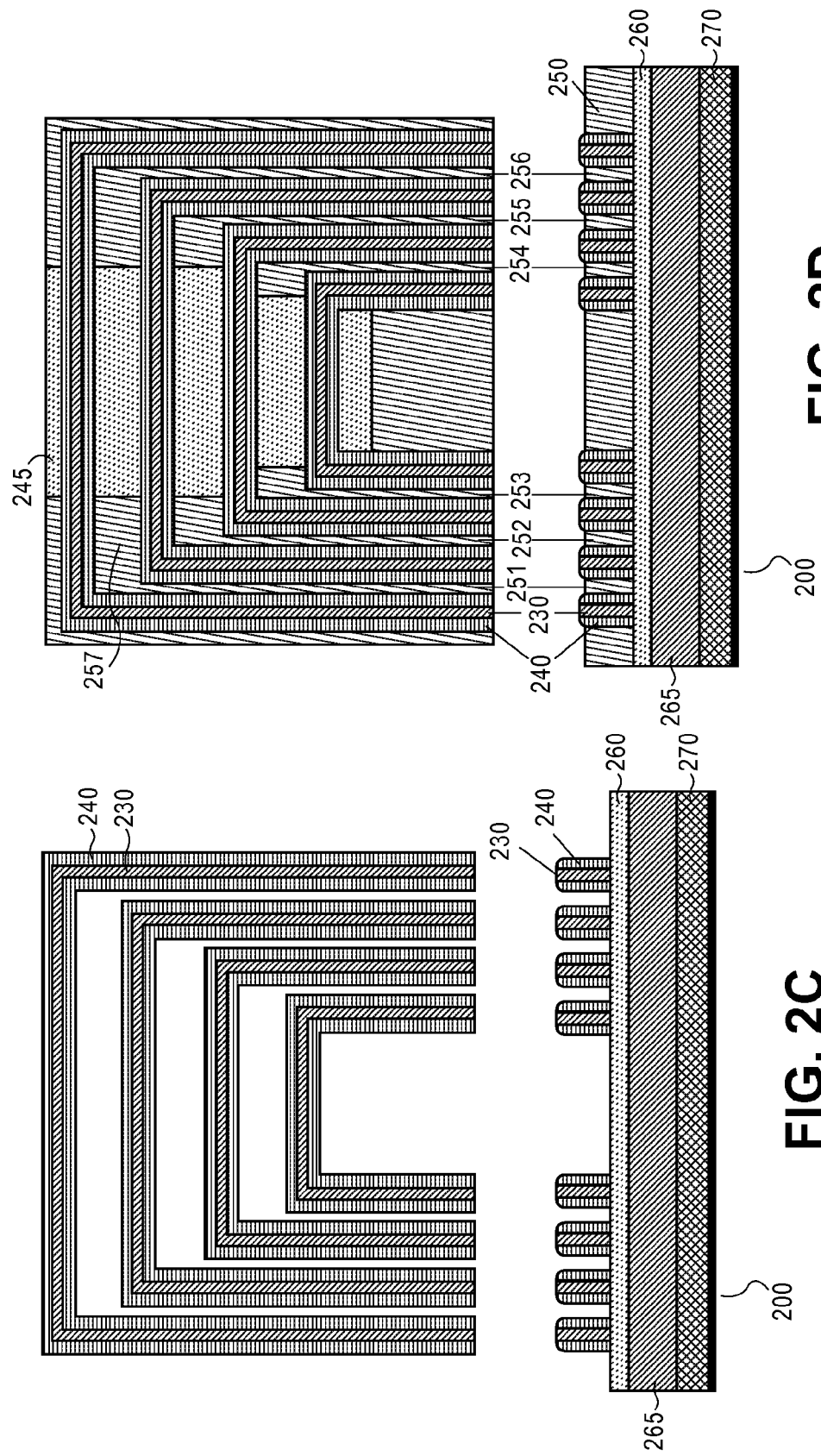

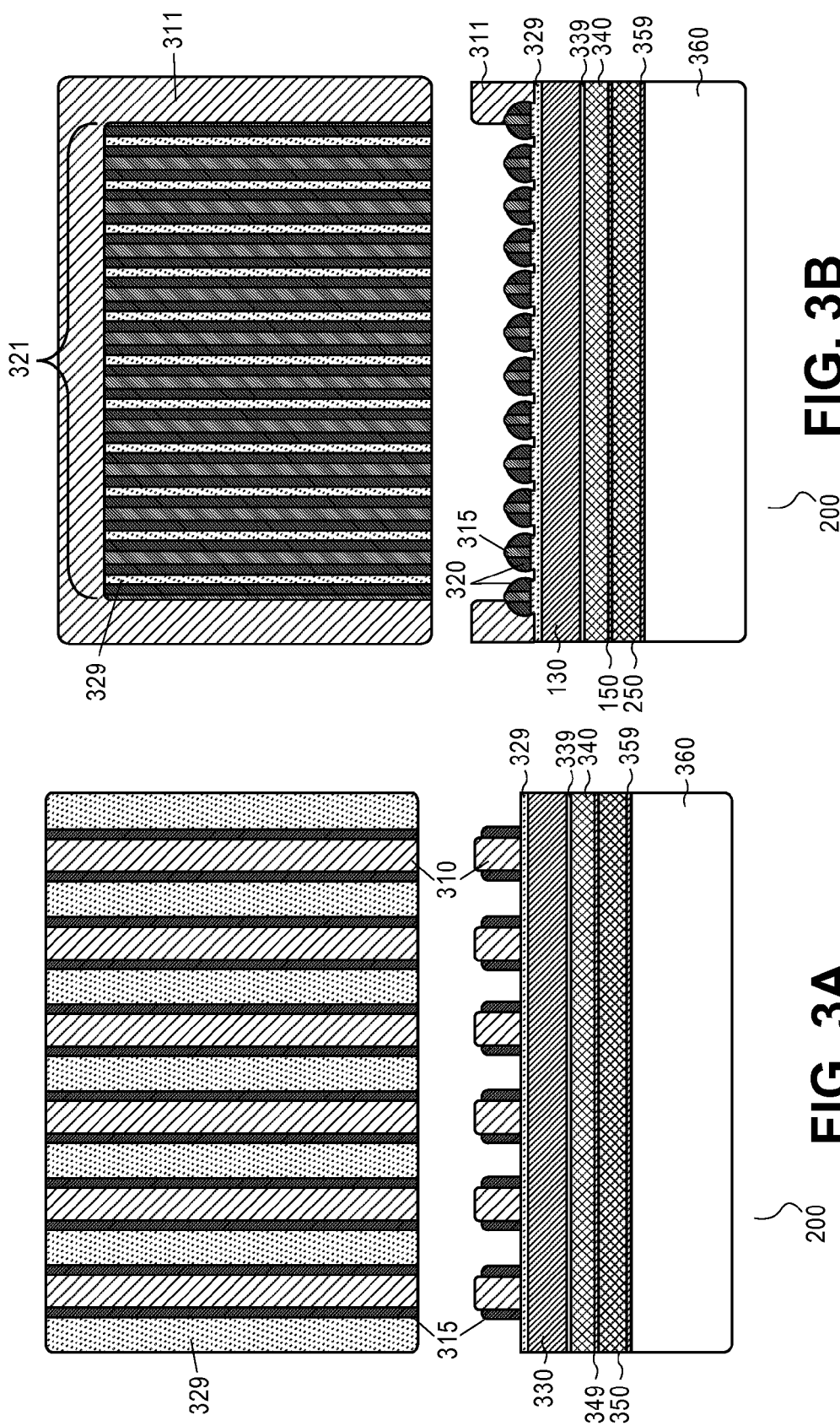

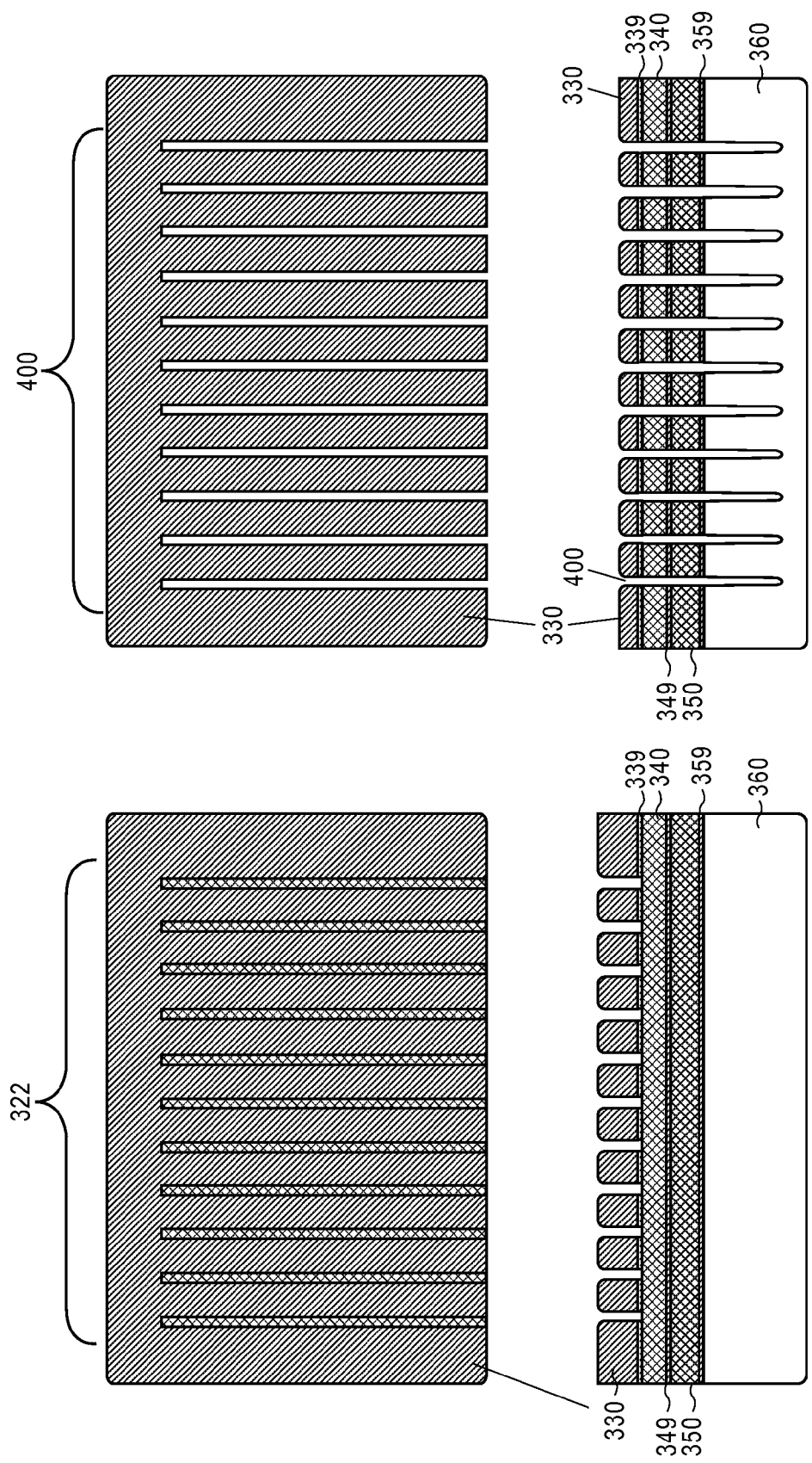

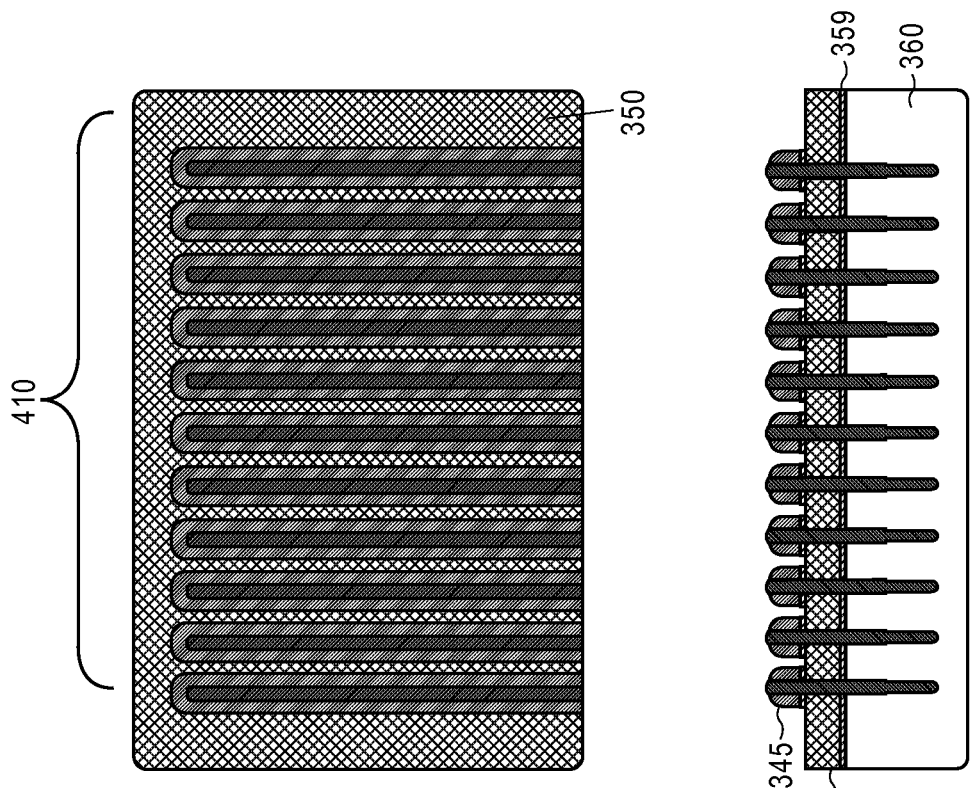
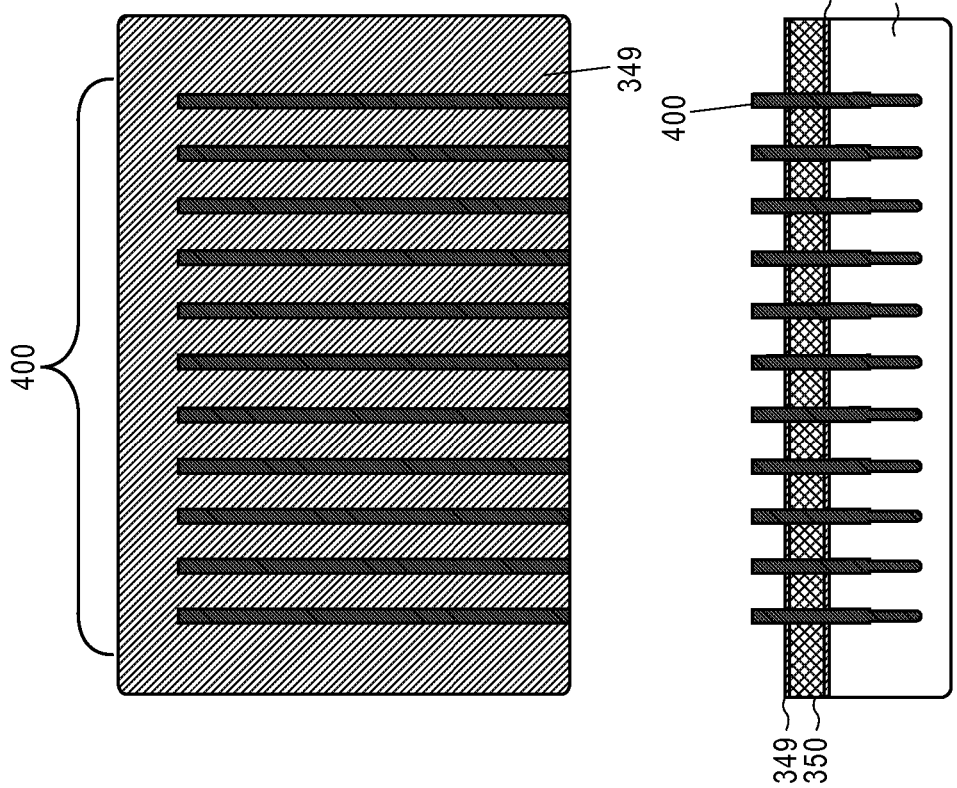
FIG. 3E
FIG. 3F

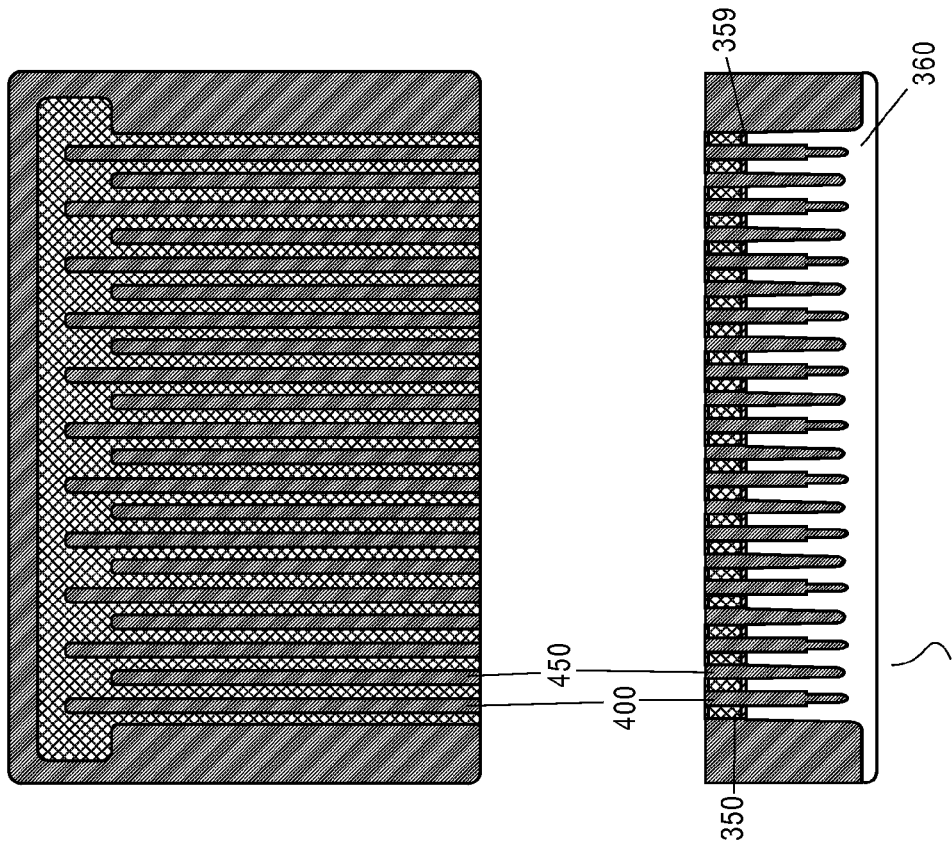
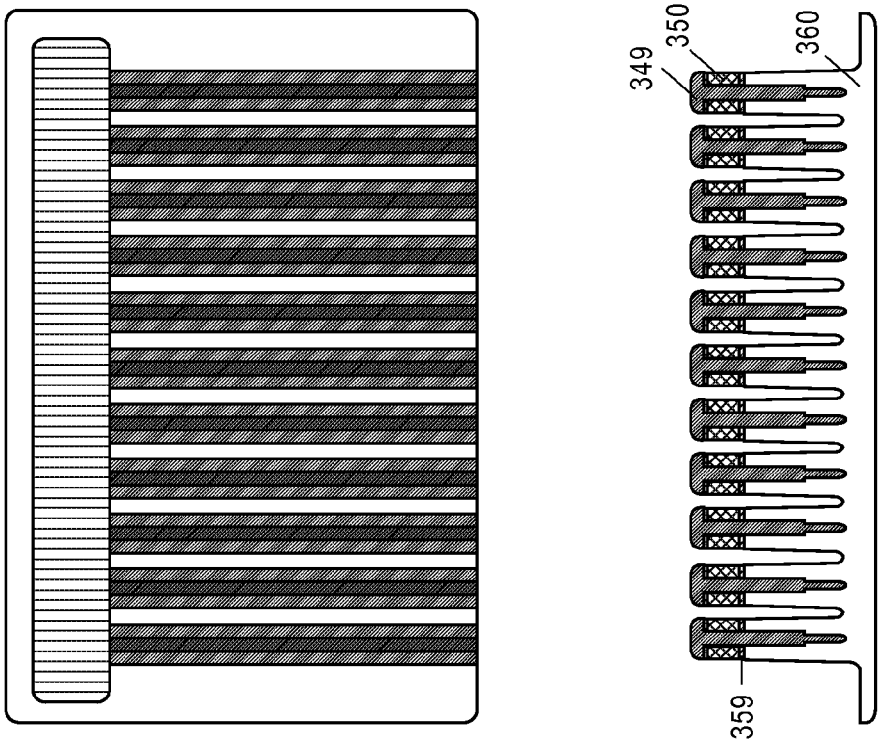
FIG. 3H
FIG. 3G

PITCH DIVISION PATTERNING TECHNIQUES

FIELD

Embodiments of the invention generally pertain to semiconductor processing and more specifically to pitch division techniques and processing acts to increase physical stability of pitch divided lines.

BACKGROUND

Feature sizes for integrated circuits are continuously being reduced in response to many factors, including demand for increased portability, computing power, memory capacity and energy efficiency. Reduced feature sizes for integrated circuits are related to the techniques used to form said features. For example, lithography is commonly used to pattern features (e.g., conductive lines) of integrated circuits. The periodicity of these patterned features maybe described as a pitch.

Pitch describes the distance between identical points of two neighboring features. Lithographic techniques cannot reliably form features below a minimum pitch due to factors such as optics and light or radiation wavelength. Thus, the minimum pitch of a lithographic technique is an obstacle to feature size reduction.

Techniques to extend the capabilities of lithographic techniques beyond their minimum pitch are referred to as pitch division, or pattern density multiplication, techniques. For example, when a pitch is halved, this reduction is referred to as pitch doubling, and when a pitch is quartered, this reduction is referred to as pitch quadrupling or pitch quad.

Prior art pitch quad techniques typically require line reduction to be finalized prior to transferring a pattern to a hard mask layer. Furthermore, if feature size is shrunk below 15 nm, the physical strength of the feature may not be enough to withstand processing environments. Pitch quad lines produced by prior art methods are susceptible to feature collapse due to capillary forces (e.g., moisture in the air, fluid processing) and shorting problems (because of the reduced space between the lines).

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 1A-1F illustrate an example process to create pitch quad lines using photo resist pads.

FIGS. 2A-2F illustrate an example process acts to create pitch quad lines using negative spacers.

FIGS. 3A-3H illustrate an example process to create lines with increased physical stability due to the ratio of the depth/vertical dimension of the lines to the width/lateral dimension of the lines.

Figure 1D:
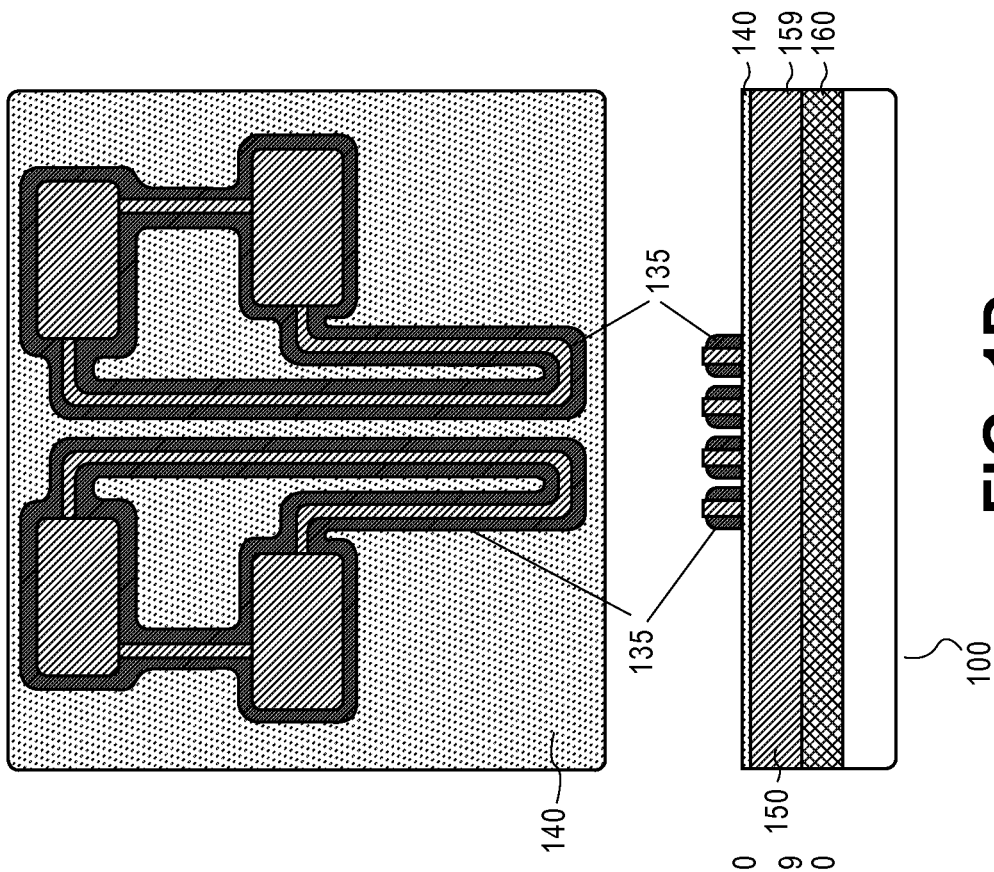

The descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

The following description provides examples, such as material types, etch chemistries, and processing conditions, in order to provide a thorough description of embodiments of the present invention; however, a person of ordinary skill in the art will understand the present invention may be practiced without employing these specific details.

Process acts and structures necessary to understand the embodiments of the present invention are described in detail below. The description below does not form a complete process flow for manufacturing a semiconductor device, and the semiconductor structures described below do not form a complete semiconductor device. Additional acts to form complete semiconductor devices from the semiconductor structures may be performed by fabrication techniques known in the art.

As described above, pitch quad techniques extend the capabilities of lithographic techniques beyond their minimum pitch. The pitch quad techniques described herein differ from the prior art by employing additional processing to ensure pitch quad lines have the spatial isolation necessary to prevent shorting problems. The pitch quad techniques described herein further employ processing acts to increase the structural robustness of pitch quad lines.

As described herein, pitch quad may be accomplished via a double "pitch double" process (i.e., a process of forming spacer layers on a pattern to halve a pitch) utilizing a patterning stack including two hard mask layers. In one embodiment, photo-resist pads are placed to overlap a first set of spacers included on a patterning stack to form a pattern. This pattern is then etched onto the first hard mask layer of the patterning stack. Another spacer layer is deposited on the etched pattern, and the first hard mask layer is selectively removed to form a second set of spacers. The second set of spacers is further processed to produce a final pitch quad mask pattern, transferred to the second hard mask layer of the patterning stack.

In another embodiment, a "shark jaw" series of pitch quad lines are produced without use of photo resist pads, but rather with an additional spacer layer to form "negative spacers." Negative spacers comprise a deposited spacer layer that is subsequently removed (i.e., the negative spacers never form lines of the final pattern) to produce a pattern of lines spaced apart in a staggered "shark jaw" formation.

If a quad pitch line comprises a lateral dimension below 15 nm, the physical strength of the line may not be enough to withstand processing environments. Pattern distortion and damaging may be difficult to control with the conventional aspect ratios of pitch quad lines produced by the prior art. In one embodiment, two full stack etches are used to avoid, during processing, individual pitch quad lines wherein each line comprises a lateral dimension equal to the space between each line (i.e., the final pitch quad line may comprise a lateral dimension equal to the spacing between the lines, but this is avoiding during the processing stages). This embodiment processes lines with an increased physical stability due to the increased ratio of the depth/vertical dimension of the line to the width/lateral dimension of the line that is encountered during processing.

Illustrations included herein, are not drawn to scale and are not meant to be actual views of any particular semiconductor structure or semiconductor device. Rather, the illustrations are merely idealized representations that are employed to describe the present invention. Additionally, elements common between illustrations may retain the same numerical designation.

FIGS. 1A-1G illustrate top-views and cross-sectional views of a patterning stack processed according to an embodiment of the invention. With reference to FIG. 1A, patterning stack 100 includes first dielectric anti-reflective coating (DARC) layer 120, first hard mask layer 130, second DARC layer 140, second hard mask layer 150, thin silicon dioxide layer 159, and substrate layer 160. First and second hard mask layers 130 and 150 may comprise, for example, one of transparent carbon, amorphous carbon, silicon containing hardmask, or metal containing hardmask.

As stated above, illustrations of patterning stack layers are not meant to accurately represent the scale of each layer. For example, the first and second DARC layer, functioning as an etch-stop, may each comprise a thickness of 2-4 nm and the first and second hard mask layer may each comprise a thickness of 50-100 nm.

Patterning stack 100 may further include photo resist pattern 110. In this embodiment, photo resist pattern 110 includes lines 111 and 112 with large pads 113 and 114, which will subsequently be branched for future contact landing pads (described below). Lines 111 and 112 have a lateral dimension of 4 F and are equally spaced by a distance of 4 F, wherein 8 F is the minimum lithography pitch.

FIG. 1A further illustrates patterning stack 100 after a spacer layer is applied to photo resist pattern 110 to form spacers 115. This spacer layer (and subsequent spacer layers discussed below) may comprise any low temperature, conformal thin film deposition (e.g., silicon dioxide, silicon nitride, silicon carbonate, silicon oxynitride). This spacer layer (and subsequent spacer layers discussed below) may be deposited according to methods known in the art—e.g., chemical vapor deposition using O3 and TEOS to form silicon oxide, atomic layer deposition using a silicon precursor with an oxygen or nitrogen precursor to form silicon oxides and nitrides. Spacers 115 may be formed by any method known in the art (e.g., a reactive ion etch (RIE) process selectively stopping at DARC layer 120). Spacers 115 may comprise a lateral dimension of ¼ of the photo resist pattern, i.e., 1 F. This will be the final lateral dimension of the pattern.

FIG. 1B illustrates, after spacers 115 are formed, photo resist pattern 110 may then be selectively removed via an O2 or forming gas plasma process to expose spacers 115. Photo resist 110 may also be removed via a wet etch process.

After photo resist pattern 110 is removed, photo resist pads 101-104 may placed over the spacer at the ends of the spacers 115. The placement of the pads is such that it will divide or branch the subsequent spacers described below. Photo resist pads 101-104 thus serve as a "redistribution spacer" to ensure subsequent formed lines are not too close together and are spatially isolated from each other. In this embodiment, photo resist pads 101-104 are illustrated as having a staggered placement. This placement will provide additional space in for subsequent placement of contact landing pads for the final pattern lines, as described below.

Figure 1C:
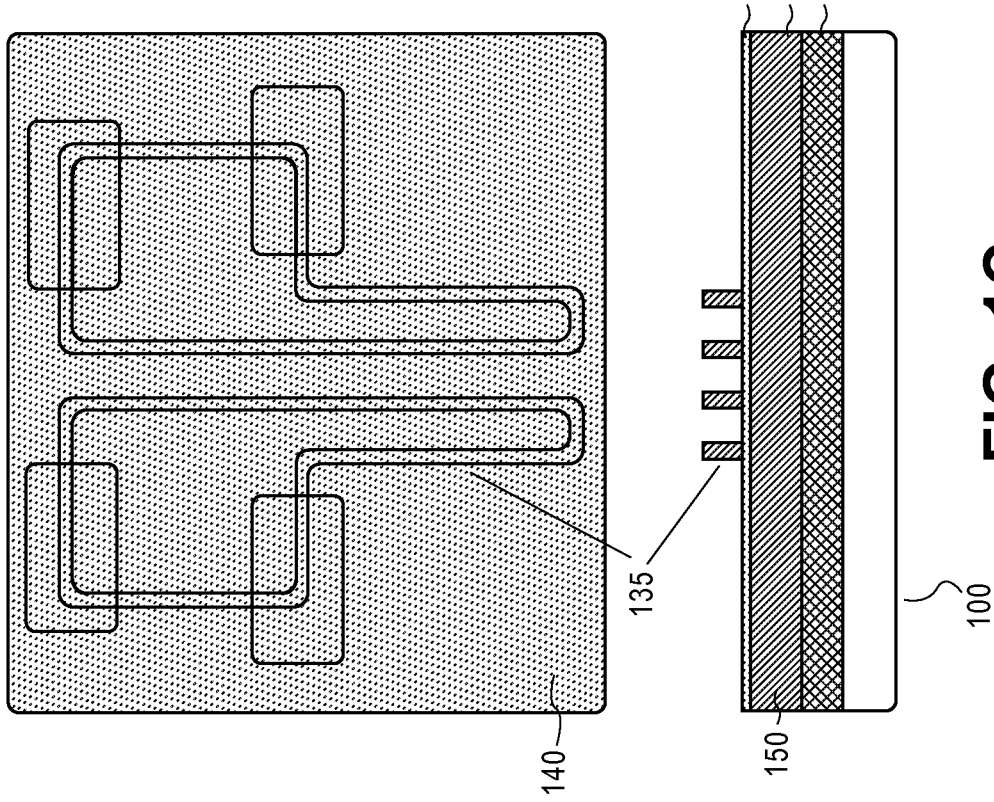

FIG. 1C illustrates the pattern formed by spacers 115 and photo-resist pads 101-104 transferred to first hard mask layer 130 to form pattern 135. This transfer may be executed via an RIE process. In another embodiment (not illustrated), spacers 115 are transferred to first hard mask layer 130, and photo resist pads 101-104 are placed onto hard mask layer 130 (rather than spacers 115) in order to redistribute the second spacer layer described below.

FIG. 1D illustrates a second spacer layer deposited on pattern 135 to form spacers 136. The lateral dimension of spacers 136 may determine the final critical dimension of the resulting pattern (i.e., 1 F). Spacers 136 are spread out based on the previous placement of photo resist pads 101-104.

Figure 1F:
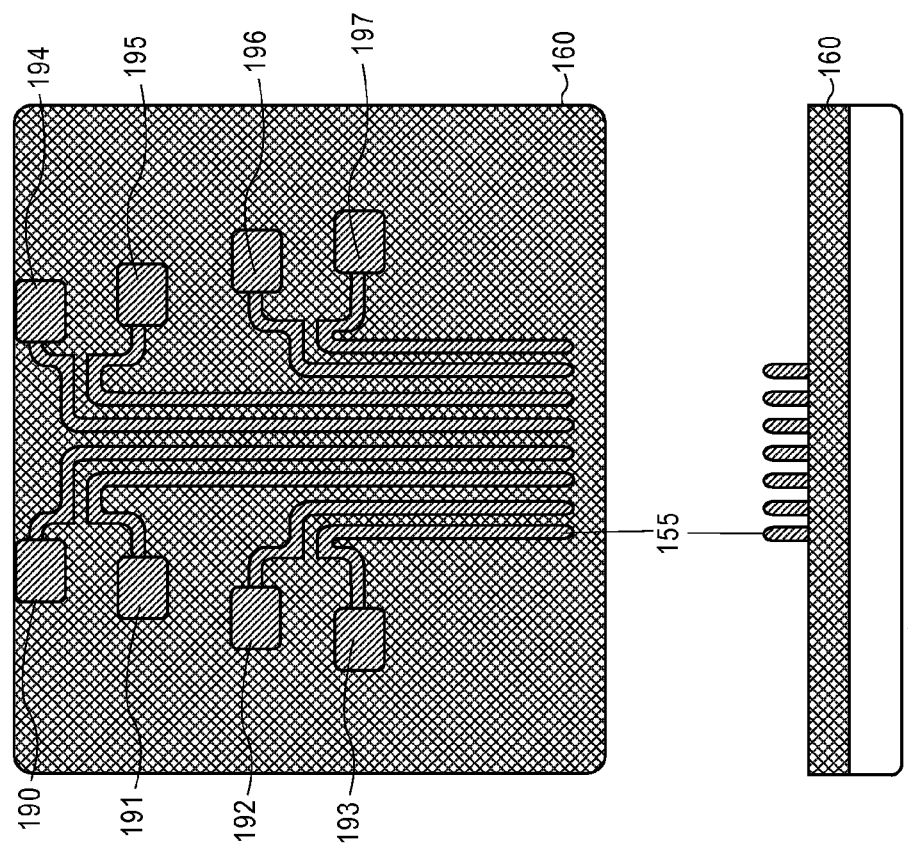
Figure 1E:
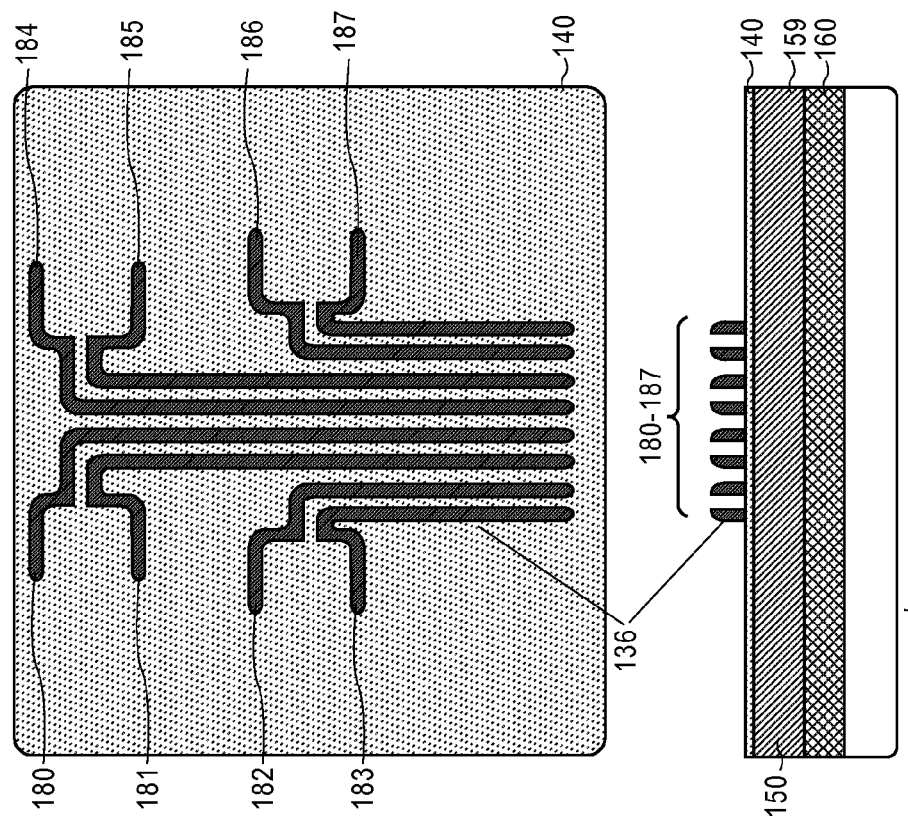

FIG. 1E illustrates pattern 135 with the remaining hard mask layer subsequently removed via processes known in the art (e.g., with a plasma or wet chemical etching process), such that spacers 136 remain as pitch quad lines. As illustrated in the cross section view included in FIG. 1E, the space between spacers 136 is 1 F and the lateral dimension of the lines of spacers 136 is 1 F—i.e., one quarter of the initial lithographic pitch of photo resist pattern 110. Furthermore spacers 136, as illustrated comprise eight lines—i.e., four times the original amount of lines formed by photo resist pattern 110 (two).

The ends of spacers 136 may be "chopped" via a selective RIE or wet etch process to form lines 180-187. The ends of spacers 136, as illustrated, may be chopped in a manner so that ends of lines 180-187 are staggered with respect to each other.

Landing contact pads 190-197 may be placed on ends 180-187, and the pattern may then be transferred to hard mask layer 150 as illustrated in FIG. 1F. Landing pads 190-197 are structurally isolated from each other as a result of the redistribution on the lines of spacers 136 via photo resist pads 101-104. Landing pads 190-197 are sufficiently spaced as to eliminate potential shorting issues. This pattern may be combined with any peripheral CMOS components.

Resulting hard mask pattern 155 may be transferred to substrate layer 160. It will be appreciated that substrate layer 160 may include a layer of a single material, a plurality of layers of different materials, a layer or layers having regions of different materials or structures in them, etc. These materials may include semiconductors, insulators, conductors, or combinations thereof. For example, the substrate may comprise gallium nitride, doped polysilicon, an electrical device active area, or a metal layer (e.g., a tungsten, tungsten silicide, titanium nitride, aluminum or copper layer, or combinations thereof). As described above, pattern 155 may directly correspond to the desired placement of conductive features, such as interconnects, in the substrate.

Figure 2F:
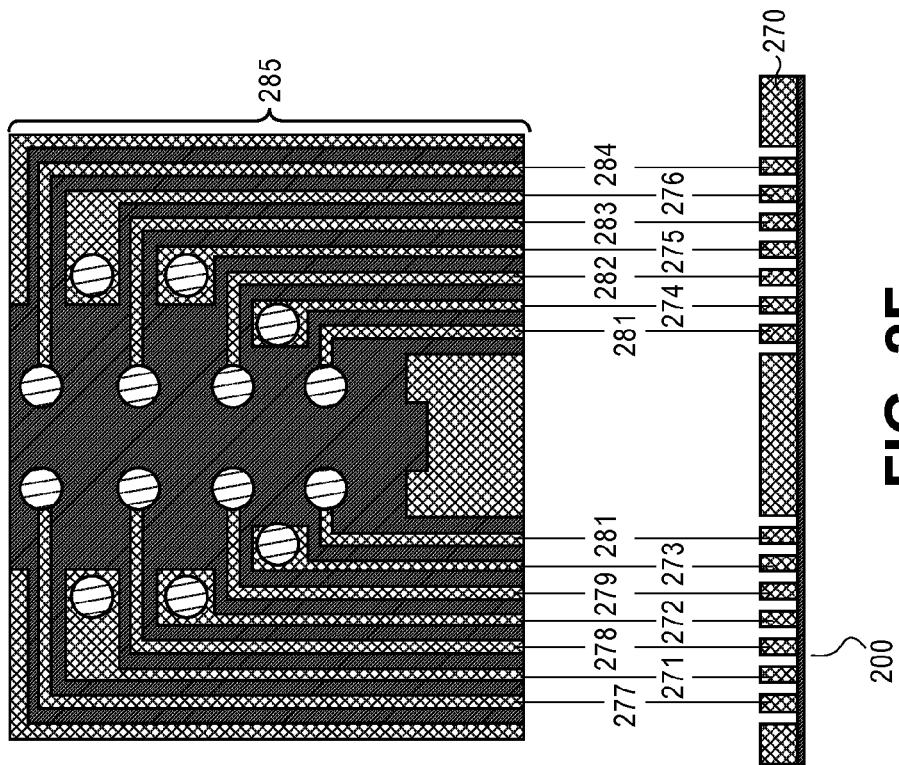

In another embodiment, a "shark jaw" series of pitch quad lines may be produced without the use of photo-resist pads 101-104. FIGS. 2A-2F illustrate top-views and cross-sectional views of a patterning stack processed according to an embodiment of the invention. FIG. 2A illustrates patterning stack 200 (similar to patterning stack 100) including first DARC layer 220, first hard mask layer 225, second DARC layer 260, second hard mask layer 265, and substrate layer 270. Patterning stack 200 may further include photo resist pattern 210. In the illustrated embodiment, lines of photo resist pattern 210 comprise a lateral dimension of 3 F after inclusion of a resist trim from 4F. For example, photo resist pattern 210 may be etched using any etching method known in the art to adjust the lateral dimensions of the lines of photo resist pattern 210. The extent of the etch is preferably selected so that the lateral dimensions of the modified lines are substantially equal to the desired spacing between subsequent formed spacers described below.

Dimension 201 of photo resist pattern 210 and space 202 between lines of photo resist pattern 210 are degrees of freedom that can be adjusted to account for subsequent contact landing pads described below. These degrees of freedom may further contribute to the redistribution of the line ends of the final pitch quad lines.

A spacer layer is deposited on photo resist pattern 210 to form spacers 215 having a lateral dimension of 1 F. FIG. 2B illustrates patterning stack 200 with photo resist pattern 210 removed, and the pattern formed by spacers 215 transferred to first hard mask layer 225 to form pattern 230. The lateral dimension of the lines of pattern 230 is 1 F.

FIG. 2C illustrates another spacer layer deposited and etched onto pattern 230 to form negative spacers 240. The term "negative" spacer is used herein to describe spacers that will be removed to create a space, as described below. The lateral dimension of the lines of spacers 240 is 1 F, and the space separating each of spacers 240 is also 1 F.

First hard mask layer 225 may then be filled with filling material 250, as illustrated in FIG. 2D. Filling material 250 as illustrated comprises a photo resist material. Filling material 250 may alternatively comprise an organic etch material, or the same material as hard mask layers 225 and 265. If filling material 250 is a photo resist material, chop pattern 245 may be formed by exposing the photo resist material. If filling material 250 is a material other than photo resist material, chop pattern 245 may be formed by further coating the fill material with photo resist, and exposing chop pattern 245.

In FIG. 2D, chop pattern 245 exposes DARC layer 260. Chop pattern 245 forms lines 251-256, made from fill material 250. Line 251 includes end 257 that may be used to include an electrical contact, thus eliminating the need for a contact landing pad (lines 252-256, as illustrated, include similar ends). Fill material 250 may further be etched or polished to expose spacers 240 and pattern 230.

Figure 2E:
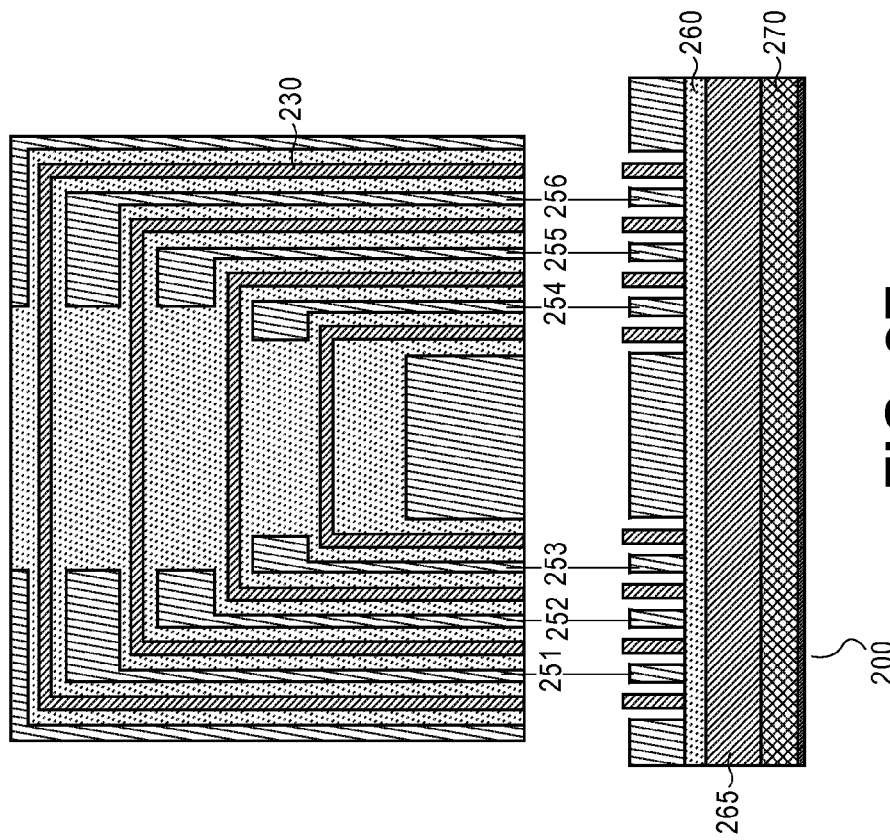

FIG. 2E illustrates patterning stack 200 with negative spacers 240 removed. Negative spacers 240 may be removed via any process known in the art (e.g., wet chemical or plasma etch). Pattern 230 may subsequently be chopped to pattern 285, which is transferred to second hard mask layer 265, and finally into substrate 270, as shown in FIG. 2F. Thus pitch quad lines 271-284 are created—lines 271-276 corresponding to lines 251-256, and lines 277-284 corresponding to chop pattern 245. Chopped pattern 245 may be shaped to account for contact landing pads required for lines 277-284 because these lines do not have a wide end similar to those of lines 217-276. Lines 271-284 are structurally isolated from each other, and will not have any shorting issues due to the lines staggered "shark jaw" placement.

Embodiments of the invention described below comprise process acts to produce trenches that will form lines with increased physical stability over the prior art due to the ratio of the depth/vertical dimension of the line to the width/lateral dimension of the line. Pitch quad processing acts, including the above pitch quad method embodiments, may be used in conjunction with the following operations.

FIGS. 3A-3H illustrate a top-view and a cross-sectional view of a patterning stack processed according to an embodiment of the invention. FIG. 3A illustrates patterning stack 300 further including DARC layer 329, hard mask layer 330, first etch stop layer 339, cap layer 340, second etch stop layer 349, floating gate poly layer 350, gate dielectric layer 359, and bulk layer 360. Cap layer 340 may be referred to as a "sacrificial" cap layer, as it will be removed during processing as described below. Cap layer 340 may comprise, for example, undoped poly cap or nitride cap. Etch stop layers 339 and 349 may comprise, for example, silicon dioxide.

Patterning stack 300 may further include photo resist pattern 310. A spacer layer may be deposited on photo resist pattern 310 for form spacers 315. Lines of photo resist pattern may have a lateral dimension of 3 F (i.e., initial lateral dimension of 4 F with trim process described above), and spacers 315 may have a lateral dimension that, when further processed, may improve the physical strength of the final line (note that spacers 315 do not necessarily define the final lateral dimension).

FIG. 3B illustrates patterning stack 300 with photo resist pattern 310 selectively removed. Additional spacer layer 320 may be deposited on spacers 315 to form pattern 321. Lines of pattern 321 comprise a lateral dimension of 3 F, each line spaced apart by a distance of 1 F. The spaces between the lines define the final lateral dimension. This pattern may be used as a mask to transfer form a pattern to hard mask layer 330. Photo resist 311 may be deposited on the peripheral areas of the pattern formed by spacers 315 and spacer layer 320.

FIG. 3C illustrates pattern 321 transferred to hard mask layer 330. As illustrated, the lines of pattern 321 have a lateral dimension of 3 F, separated by a 1 F space. Thus the lines of pattern 322 have an increased physical stability (compared to, for example, lines with a lateral dimension of 1 F separated by a 1 F space). Thus lines of pattern 322 are less susceptible to distortion during subsequent processing.

For each of the 1 F spaces separating the lines of pattern 322, etches into bulk layer 360 of the patterning stack 300 are performed to create set of trenches 400 as shown in FIG. 3D. Said etches into bulk layer 360 may be performed by any process known in the art.

Remaining hard mask layer 330 may be removed and trenches 400 may subsequently be filled with a filling material. Filling material may be any material suitable to form the resulting pitch quad lines (e.g., a spacer oxide material, spacer nitride material, a dielectric material for shallow trench isolation (STI) features, a conductor metal). First cap layer 340 may be removed to expose filled trenches 400, as illustrated by FIG. 3E. Exposed filled trenches 400 each have a lateral dimension of 1 F separated by a 3 F space, and have increased physical stability due to the vertical dimension of each filled trench.

Second spacer layer 345 may be deposited on the exposed first set of trenches to form pattern of lines 410, each line having a lateral dimension of 3 F separated by a 1 F space similar to pattern 322, as illustrated in FIG. 3F.

For each of the 1 F spaces separating the lines pattern 410, an etch into bulk layer 360 of patterning stack 300 is performed to create a set of trenches 450 as shown in FIG. 3G. Trenches 450 lines are self-aligned with each other and with filled trenches 400, due to the aforementioned processing acts. This resulting self-alignment is an improvement over prior art methods for pitch division, such as double patterning, as these methods are prone to misalignment. Additional photo resist mask 390 may be applied to add any pattern to edges 395. Trenches 450 are filled with the filling material to form a pattern of lines comprising the filled trenches 400 and 450, each filled trench comprising a lateral dimension of 1 F separated by a 1 F space as shown in FIG. 3H. In one embodiment, each of filled trenches 400 and 450 have a depth/vertical dimension of 3 F.

It is noted that terms like "preferably," "commonly," and "typically" are not utilized above to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention. Many modifications may be made to adapt the teachings of the present invention to a particular situation without departing from the scope thereof.

The invention claimed is:

1. A method comprising:
    depositing a first spacer layer on a first set of spacers to form a first pattern of lines having a lateral dimension of 3 F separated by a 1 F space included on a patterning stack, wherein 1 F is a first final feature size and 3 F is a second size three times the size of 1 F, the patterning stack to further include a hard mask layer, a first etch-stop layer, a second etch-stop layer, and a bulk layer;
    transferring the first pattern to the hard mask layer;
    for each of the 1 F spaces separating the lines of the first pattern, performing an etch into the bulk layer of the patterning stack to create a first set of trenches;
    removing the remaining hard mask layer and filling each of the first set of trenches with a filling material;
    removing the first etch-stop layer to expose the filled first set of trenches;
    depositing a second spacer layer on the exposed first set of filled trenches to form a third pattern of lines having a lateral dimension of 3 F separated by a 1 F space;
    for each of the 1 F spaces separating the lines of the third pattern, performing an etch into the bulk layer of the patterning stack to create a second set of trenches; and
    filling each of the second set of trenches with the filling material to form a fourth pattern of lines comprising the first and second set of filled trenches, wherein lines of the fourth pattern comprise a lateral dimension of 1 F separated by a 1 F space.

2. The method of claim 1, wherein the first set of spacers are created by
    depositing an initial spacer layer on a photo resist pattern included in the patterning stack; and
    selectively removing the photo resist pattern from the patterning stack to form the first set of spacers, wherein each of the spacers comprise a lateral dimension of 1 F and are spaced apart by 3 F.

3. The method of claim 1, further comprising:
    polishing the patterning stack to the second etch-stop layer to expose the first and second set of trenches.

4. The method of claim 1, further comprising:
    depositing photo resist layer on peripheral areas of the first pattern.

5. The method of claim 1, further comprising:
    applying an additional photo resist layer to form a plurality of edges for the third pattern; and
    performing an etch on the photo resist layer of the third pattern.

6. The method of claim 1, wherein the first spacer layer, the second spacer layer and the filling material each comprise a spacer oxide, and the hard mask layer comprises at least one of transparent carbon and amorphous carbon.

7. The method of claim 1, wherein the filling material comprises at least one of a dielectric material and a conductor metal.

8. The method of claim 1, wherein performing an etch comprises performing a reactive ion etch (RIE).

9. The method of claim 1, wherein the lines of the fourth pattern comprise a lateral dimension of 1 F.

* * * * *